(12) United States Patent
Chang et al.

(10) Patent No.: US 7,868,439 B2
(45) Date of Patent: Jan. 11, 2011

(54) CHIP PACKAGE AND SUBSTRATE THEREOF

(75) Inventors: Wen Yuan Chang, Shindian (TW); Chih-An Yang, Shindian (TW)

(73) Assignee: Via Technologies, Inc., Taipei (TW)

( * ) Notice: Subject to any disclaimer, the term of this patent is extended or adjusted under 35 U.S.C. 154(b) by 208 days.

(21) Appl. No.: 11/508,295

(22) Filed: Aug. 23, 2006

(65) Prior Publication Data

US 2007/0069361 A1    Mar. 29, 2007

(30) Foreign Application Priority Data

Sep. 23, 2005    (TW) .............................. 94133258 A

(51) Int. Cl.
*H01L 23/02*    (2006.01)

(52) U.S. Cl. .................. 257/686; 257/685; 257/679; 257/706; 257/713; 257/737; 257/777; 257/E23.175; 257/E25.029; 438/108

(58) Field of Classification Search .................. 257/782, 257/E23.145, 679, 777, 706, 713, 737, E23.175, 257/E25.029, 685, 686; 438/108
See application file for complete search history.

(56) References Cited

U.S. PATENT DOCUMENTS

| 6,008,534 | A  | * | 12/1999 | Fulcher ...................... 257/691 |
| 6,376,917 | B1 | * | 4/2002  | Takeshita et al. ............ 257/778 |
| 2002/0011676 | A1 | * | 1/2002 | Akram et al. ................ 257/777 |
| 2002/0119650 | A1 | * | 8/2002 | Whetsel et al. ............. 438/613 |
| 2003/0168256 | A1 | * | 9/2003 | Chien ......................... 174/264 |
| 2005/0051903 | A1 | * | 3/2005 | Ellsberry et al. ............ 257/777 |
| 2005/0146030 | A1 | * | 7/2005 | Miyazaki .................... 257/738 |

* cited by examiner

*Primary Examiner*—Chuong Q Nguyen
*Assistant Examiner*—Meiya Li
(74) *Attorney, Agent, or Firm*—Birch, Stewart, Kolasch & Birch, LLP

(57) ABSTRACT

A chip package coupled to a circuit board includes a substrate and at least one chip. The substrate includes a plurality of first pads, a plurality of second pads and at least one first interconnecting structure. The first pads and the chip are located on a first surface of the substrate and the second pads are located on a second surface of the substrate. The first interconnecting structure is coupled with the chip, one of the first pads and one of the second pads for flexible design of various applications. A substrate of the chip package is also disclosed.

20 Claims, 9 Drawing Sheets

CHIP PACKAGE AND SUBSTRATE THEREOF

BACKGROUND OF THE INVENTION

1. Field of Invention

The present invention relates to a chip package and a substrate thereof, and more particularly to a chip package and a substrate thereof disposing pads at both sides.

2. Related Art

As shown in FIG. 1, a conventional multi-chip module (MCM) 1 includes a substrate 11, a plurality of chips 12 stacked upon the substrate 11, a plurality of bonding wires 13 connected the chips 12 with the substrate 11, and an encapsulating material 14 disposed on the substrate 11 and covered the chips 12 and the wires 13.

The multi-hip module (MCM) 1 will be malfunctioned if any one of the chips 12 is damaged or two of the bonding wires 13 are a short circuit. Many problems are also induced, such as the reliability of the MCM is reduced, the yield of fabricating processes is reduced, and the manufacturing cost is increased. The solution in the prior art of the above-mentioned problems is performing a functional test to the chips 12 first. Then choosing those the qualified chips, which are passed the functional test and are also so-called known good die (KGD), to form the multi-chip module (MCM) 1. The reliability of the multi-chip module (MCM) 1 is thus improved by removing the fault parts of the chips 12.

As shown in FIGS. 2a and 2b, a conventional multi-package module (MPM) 3 is a stacked MPM. The multi-package module (MPM) 3 includes a plurality of flip-chip packages 31 and 32. The flip-chip package 31 is stacked on a substrate 321 of the flip-chip package 32.

More pads 322 are disposed on one surface the substrate 321 as the signal terminals, the ground terminals, the power terminals, and the test terminals of the flip-chip packages 31, 32 in the multi-package module (MPM) 3. The pads 322 are disposed in highly concentrated such that the layout of the internal circuit of the substrate 321 becomes complicated and hard. More particularly, the problem of short circuits during fabrications or the electrical interference, such as crosstalk for example, is induced as the increasing in layout density. Thus, the design cost and manufacturing cost of the substrate 321 are further increased to solve those problems. On another hand, the heat dissipating of the flip-chip package 32 is limited by the stacked flip-chip package 31.

Accompanying to the electronic products, such as the chip package and the multi-package module, trend to a compact size, the substrate has to be scale-down. It is therefore an important subject of the present invention to provide a chip package and a substrate thereof having sufficient pads to be used for signal terminals, ground terminals, power terminals, and test terminals of the chips or the packages within a smaller scale of substrate.

SUMMARY OF THE INVENTION

One chip package according to the present invention is capable of coupling to a circuit board. The chip package includes a substrate and at least one chip. The substrate includes a plurality of first pads, a plurality of second pads and at least one interconnecting structure. The first pads are located on a first surface of the substrate, and the second pads are located on a second surface of the substrate. The chip is disposed on the first surface of the substrate. The interconnecting structure is coupled with the chip, one of the first pads and one of the second pads.

One substrate according to the present invention is capable of coupling at least one chip to a circuit board. The substrate includes a first surface, a second surface, at least one first pad, at least one second pad and at least one interconnecting structure. The first pad is disposed on the first surface to physically and electrically connect to the chip. The second pad is disposed on the second surface. The interconnecting structure is coupled with the chip, the first pad and the second pad.

BRIEF DESCRIPTION OF THE DRAWINGS

The present invention will become more fully understood from the detailed description given herein below illustration only, and thus is not limitative of the present invention, and wherein:

FIG. 2b is a bottom view showing the conventional multi-package module in FIG. 2a;

FIG. 3b is a bottom view showing the chip package according to the first embodiment of the present invention in FIG. 3a;

FIG. 3c is a top view showing the chip package according to the first embodiment of the present invention in FIG. 3a;

FIG. 3d is a partial enlarged view showing the chip package according to the first embodiment of the present invention in FIG. 3a;

DETAILED DESCRIPTION OF THE INVENTION

The present invention will be apparent from the following detailed description, which proceeds with reference to the accompanying drawings, wherein the same references relate to the same elements.

Figure 1:
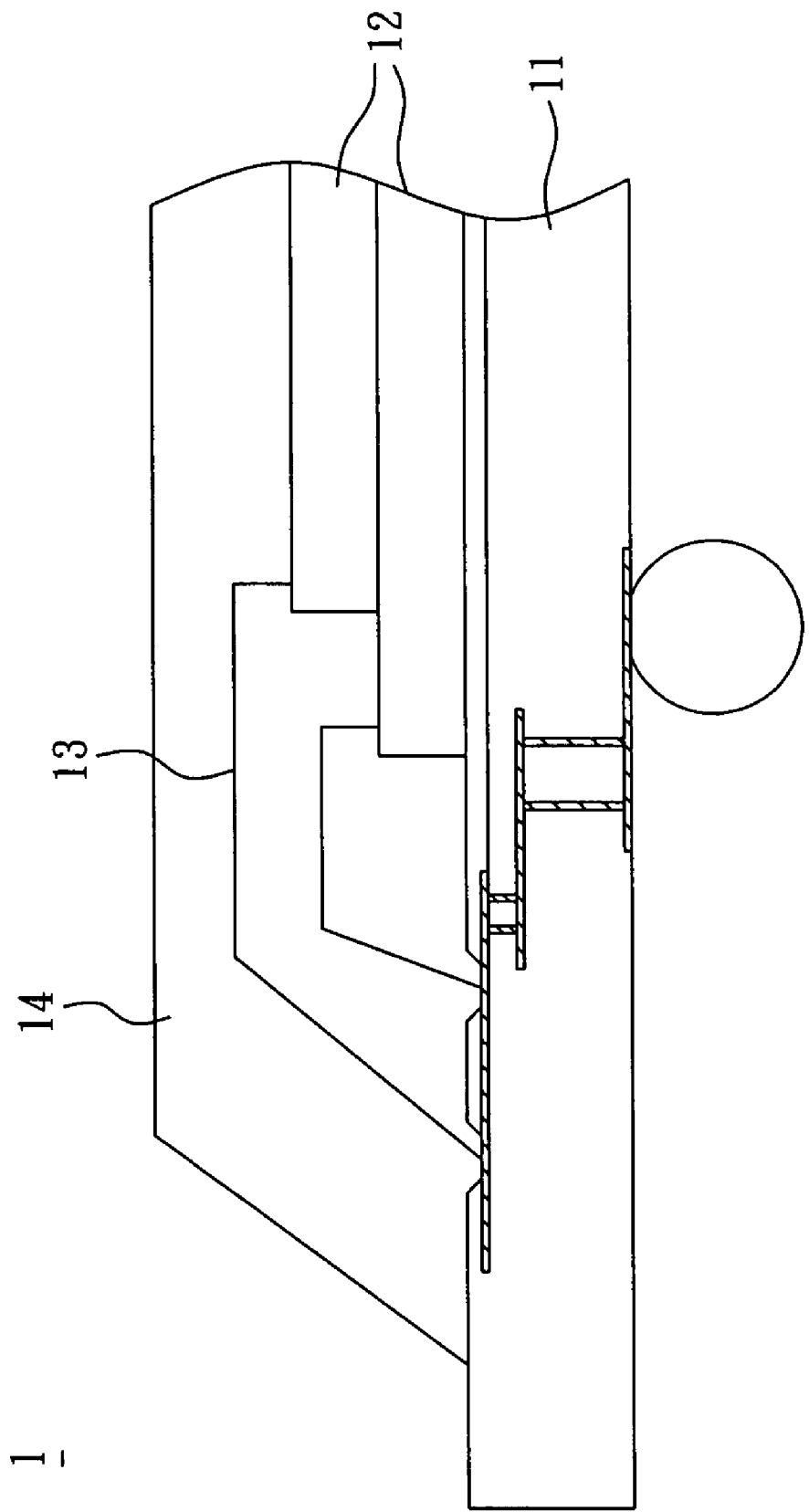
FIG. 1 is a schematic view showing a conventional multi-chip module.
Figure 2A:
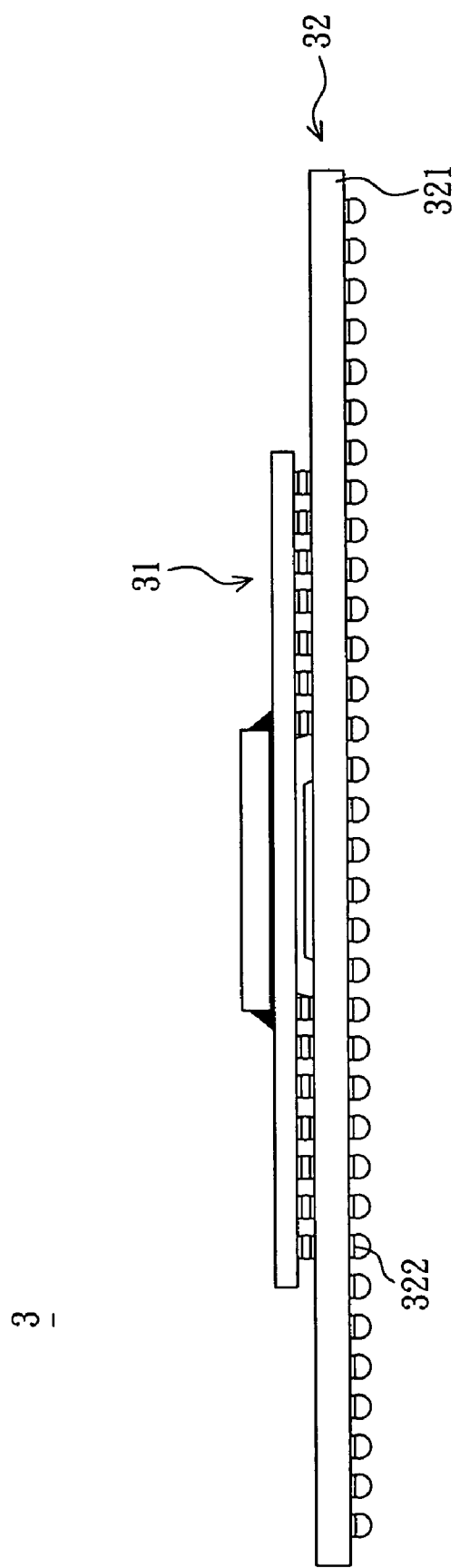
FIG. 2a is a schematic view showing a conventional multi-package module.
Figure 2B:
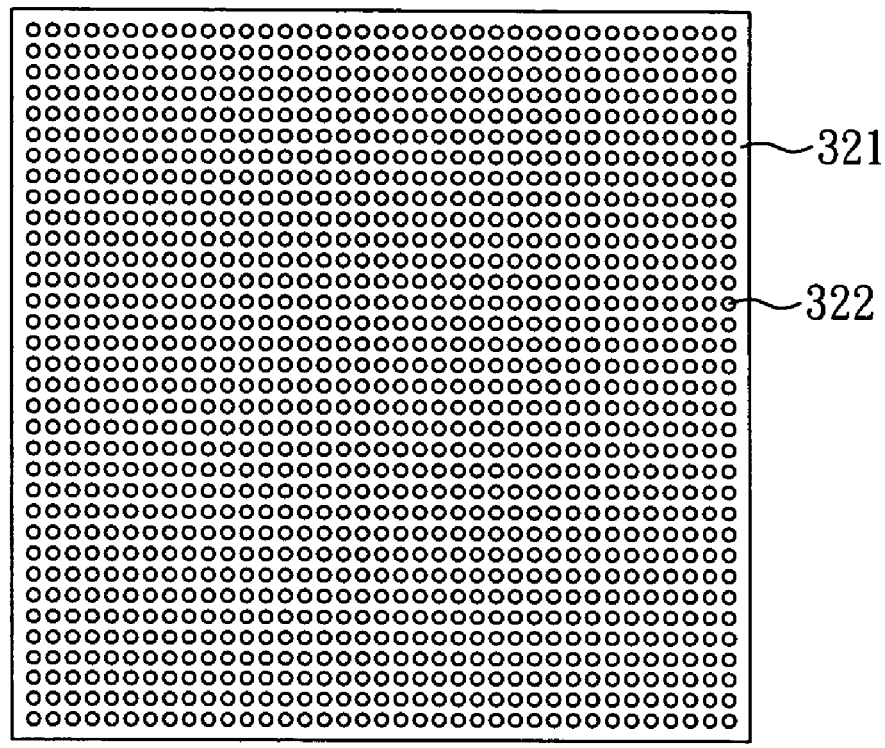
Figure 3A:
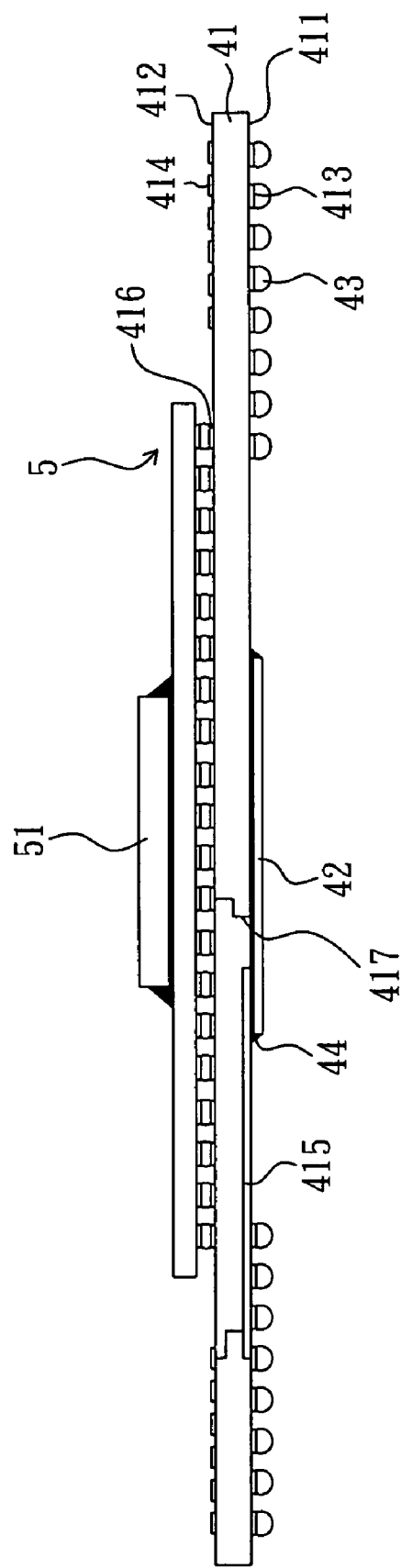
FIG. 3a is a schematic view showing a chip package according to a first embodiment of the present invention.
Figure 3B:
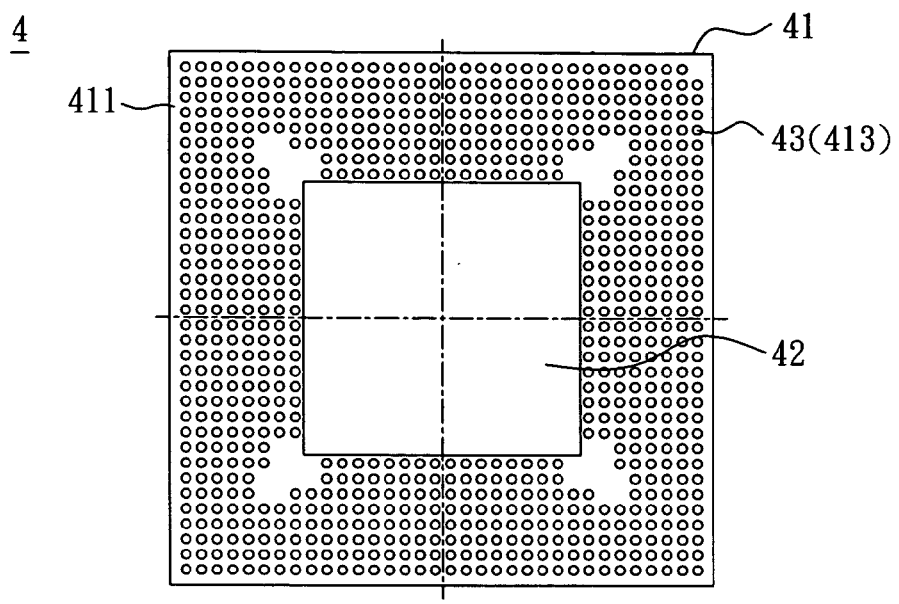
Figure 3C:
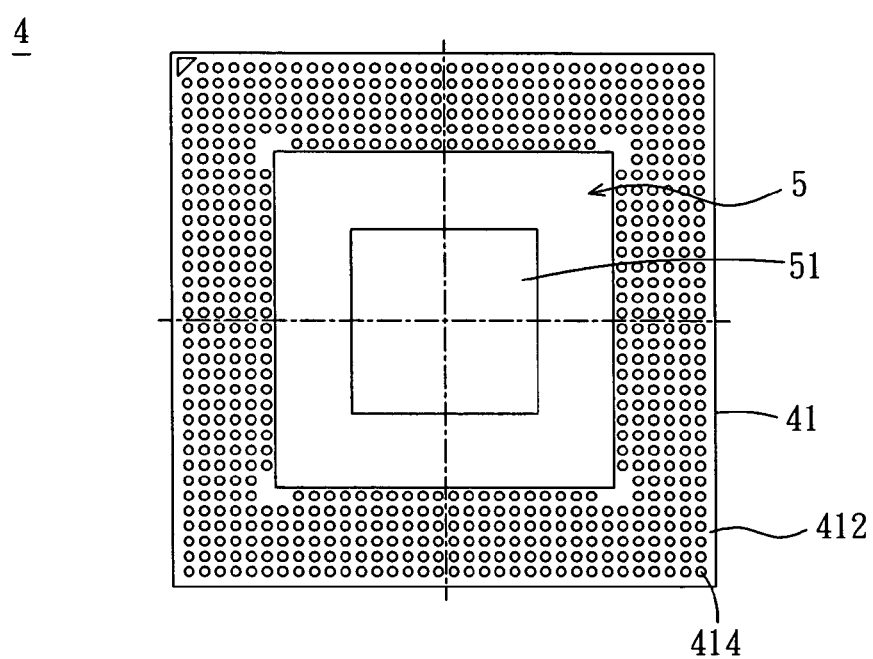

Referring to FIGS. 3a to 3d, a first chip package 4 according to a first embodiment of the present invention includes a substrate 41 and a first chip 42. The substrate 41 has a first surface 411 and a second surface 412 opposite to the first surface 411. As shown in FIG. 3b, a plurality of first pads 413 is disposed on the first surface 411 of the substrate 41. As shown in FIG. 3c, a plurality of second pads 414 is disposed on the second surface 412 of the substrate 41. In this embodiment, the first pads 413 and the second pads 414 may be formed in solder mask defined (SMD) type or non-solder mask defined (NSMD) type. For those skilled in this art, the SMD type means a solder mask layer (not shown in the figures) covering the first surface 411 or the second surface 412 and having the openings to expose the first pads 413 or the second pads 414. The first pads 413 and the second pads 414 are used as the electrically contacts of the first chip package 4.

Figure 3D:
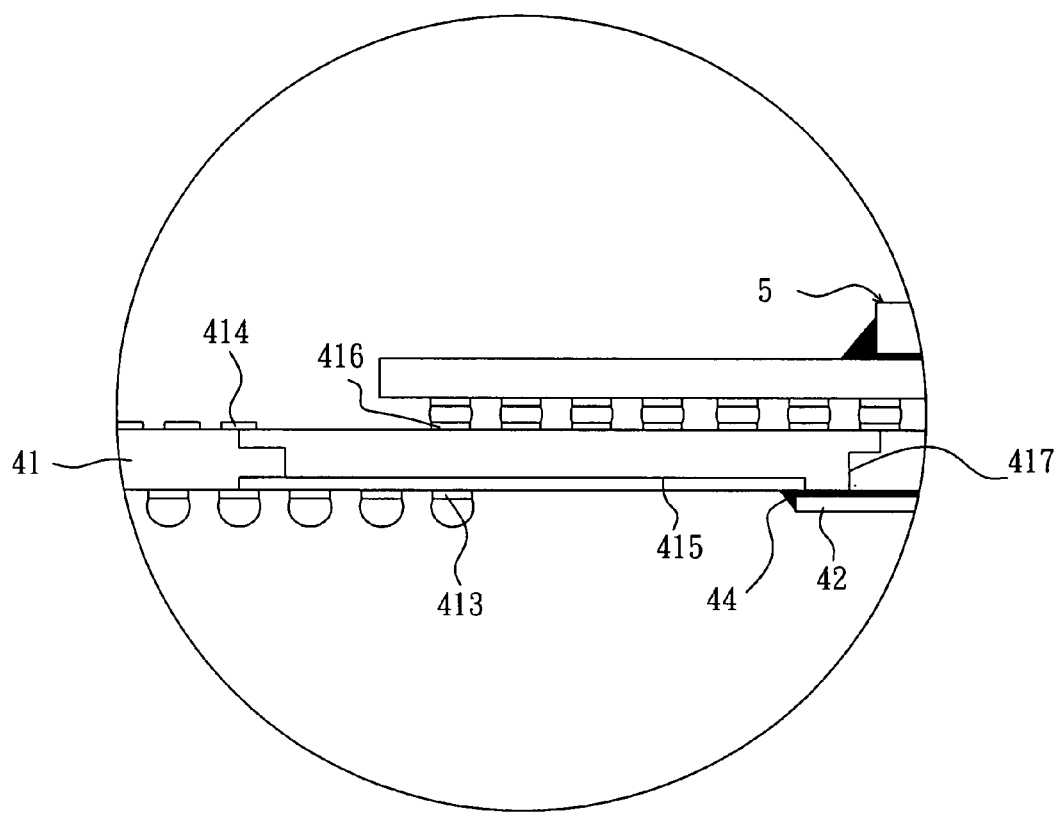

The first chip 42 is disposed on the first surface 411 of the substrate 41, which is physically and electrically connecting to the substrate 41. For example, the first chip 42 is physically and electrically connecting to the substrate 41 through a flip-chip packaging or a wire-bonding packaging. In this embodiment, the first chip 42 may be a chip set, a processor, a memory, a communication chip or a graphic chip. In addition, the substrate 41 has a plurality of first interconnecting structures 415 as shown in FIGS. 3a and 3d. Each of the first interconnecting structures 415 is coupled with the first chip 42, one of the first pads 413 and one of the second pads 414.

In this embodiment, the first chip package 4 further includes an insulating layer 44 filling in the space between the first chip 42 and the first surface 411 and filling around the first chip 42. Thus, the first chip 42 and the electrical connections between the first chip 42 and the substrate 41 can be well-protected by the insulating layer 44.

In this embodiment, the first chip package 4 further includes a plurality of bumps or solder balls 43 connected with the first pads 413 or the second pads 414. The bumps or solder balls 43 is used to physically and electrically connecting to a circuit board, or another chip package.

Due to the first interconnecting structures 415 is coupled with the first chip 42, one of the first pads 413 and one of the second pads 414, the designer could select one of the pads as the input/output (I/O) terminal of the chip package 4 and the other one of the pads as the test terminal of the chip package 4. As shown in FIG. 3d, the first pad 413 connecting to the first interconnecting structure 415 is one of I/O terminals of the chip 42, and the second pads 414 connecting to the first interconnecting structure 415 may be the testing terminal of the chip 42. The I/O terminal may be a signal terminal, a ground terminal, or a power terminal of the chip 42. Similarly, the second pad 414 may also act as an I/O terminal and the first pad 413 may also act as a test terminal of the first chip package 4 for other applications.

As shown in FIG. 3d, the substrate 41 further includes a plurality of third pads 416 and a plurality of second interconnecting structures 417. Each of the third pads 416 is disposed on the second surface 412 of the substrate 41. Each of the second interconnecting structures 417 is coupled with the first chip 42 and the third pad 416. The third pads 416 may be used as the I/O terminals of the first chip 42 to connect to a circuit board or another chip package.

The first chip package 4 of this embodiment may be coupled with a second chip package 5 through the third pads 416. The second chip package 5, which may be a ball grid array (BGA) package for example, has at least one second chip 51. The second chip package 5 may be a north bridge chip, a processor, a memory, a south bridge chip, a communication chip, a graphic chip or an integrated chip acting as two or more chips of above. The second chip package 5 is thus coupled with the first chip 42 through the third pads 416 and the second interconnecting structures 417. For example, the combinations of the first chip 42 and the second chip 51 may be a north bridge chip vs. a south bridge chip, a chip set vs. a processor, a chip set vs. a memory, a processor vs. a memory, a graphic chip vs. a memory, a chip set vs. a graphic chip, or a chip set vs. a communication chip. The chip set may be composed of a north bridge chip, a south bridge chip or the combination. Thus, the multi-package module including the first chip package 4 and the second chip package 5 could provide the integrated functions for a circuit board (not shown) with higher flexibility in design and in manufacture.

Figure 4:
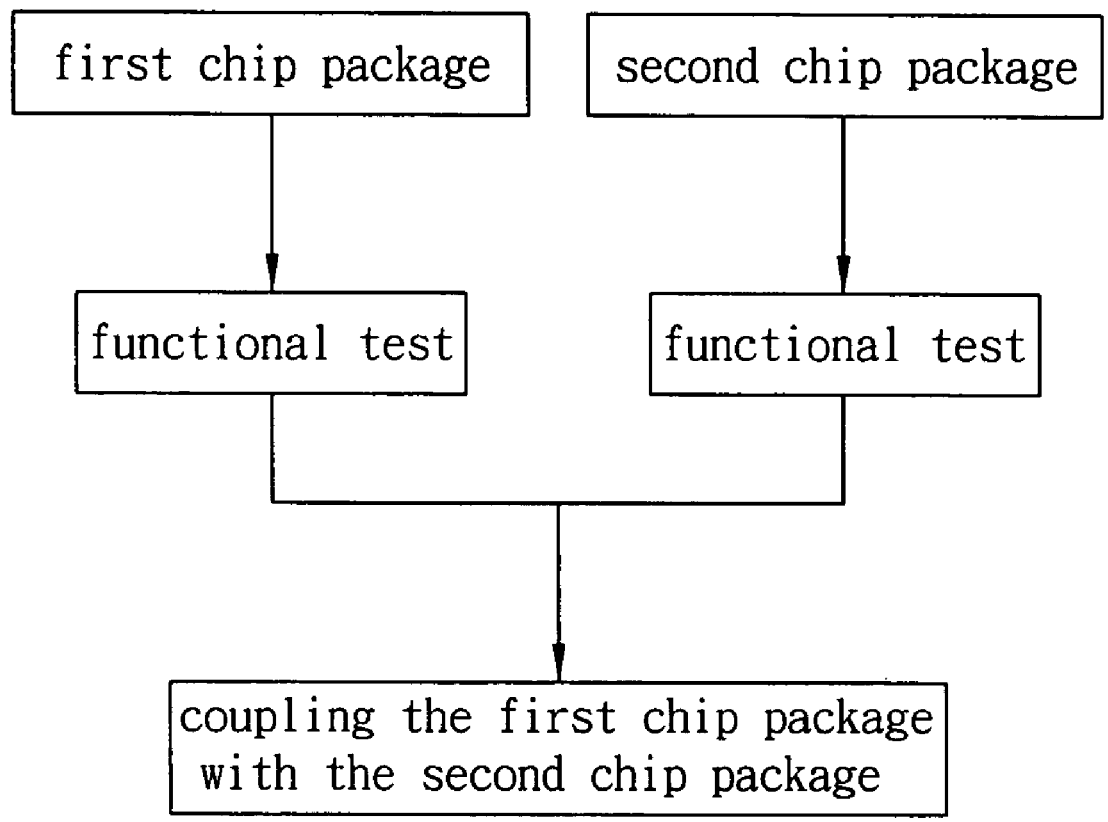
FIG. 4 is a flow chart showing the packaging steps of a chip package according to the present invention.

As shown in FIG. 4, a flow chart showing the packaging steps of a chip package according to the present invention. First, the first chip 42 is packaged on the substrate 41, such as by flip chip packaging or wire-bonding packaging. The packaging technology of the chip package is not restricted, and any other packaging technologies are also covered within the scope of the present invention.

Then, the first chip package 4 and the second chip package 5 are respectively performed a functional test to ensure the reliability and quality of each of the chip packages 4 and 5. The second chip package 4 could use the first pads 413 as the I/O terminals and the second pads 414 as the test terminals, or could use the first pads 413 as the test terminals and the second pads 414 as the I/O terminals.

Finally, the second chip package 5 is coupled with the first chip package 4. The second chip package 5 is disposed with the third pads 416 of the first chip package 4 to form a multi-package module. For example, the second chip package 5 is physically and electrically connected with the third pads 416 of the first chip package 4 by flip chip packaging, wire-bonding packaging, or another packaging technology. Another functional test to verify the whole functions of multi-package module may be implied after coupling the first chip package 4 with the second chip package 5. Similarly, the second chip package 5 could use the first pads 413 as the I/O terminals and the second pads 414 as the test terminals, or could use the first pads 413 as the test terminals and the second pads 414 as the I/O terminals.

Figure 5A:
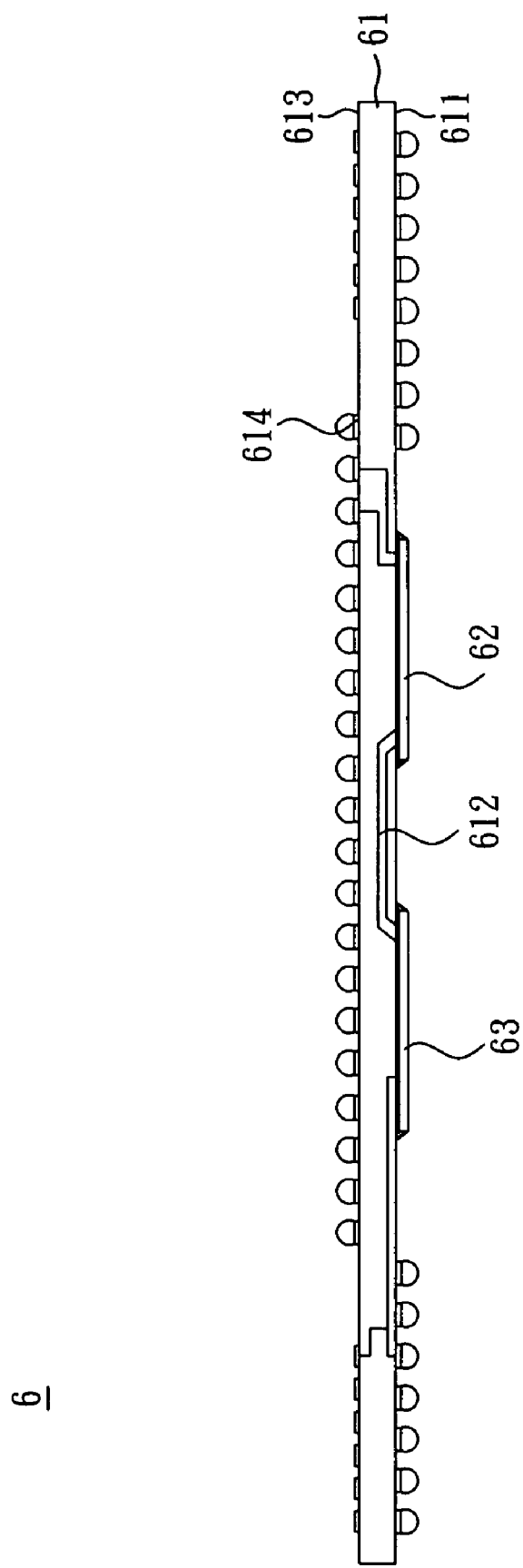
FIG. 5a is a schematic view showing a chip package according to a second embodiment of the present invention.

As shown in FIG. 5a, a chip package 6 according to a second embodiment of the present invention includes a substrate 61, a first chip 62 and a third chip 63. The substrate 61 and the first chip 62 essentially have the same constructions and functions as those of the substrate 41 and the first chip 42 in the first embodiment, and detailed descriptions thereof will be omitted.

The third chip 63 is disposed on a first surface 611 of the substrate 61. The third chip 63 may be a chip set, a processor, a memory, a communication chip or a graphic chip. For example, the first chip 62 is a north bridge chip and the third chip 63 is a south bridge chip, a memory, a communication chip or a graphic chip. In this embodiment, the substrate 61 further includes at least one third interconnecting structure 612 for coupling the first chip 62 with the third chip 63.

Figure 5B:
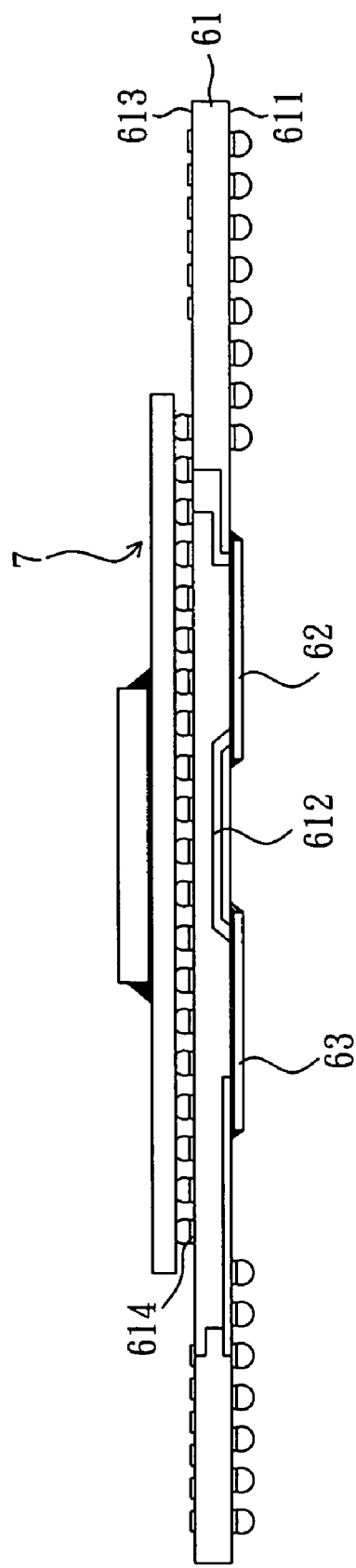
FIG. 5b is another schematic view showing the chip package according to the second embodiment of the present invention.

As shown in FIG. 5b, the chip package 6 of this embodiment may be coupled with another chip package 7. The chip package 7 is disposed on a plurality of third pads 614 which are located on a second surface 613 of the substrate 61. For example, the chip package 7 is a processor if the first chip 62 is a north bridge chip and the third chip 63 is a south bridge chip, a memory, a communication chip or a graphic chip. The present invention also provides a substrate including at least one first pad on a first surface, at least one second pad on a second surface and at least one interconnecting structure. Because the interconnecting structure coupled a first chip, a first pad and a second pad, the designer could choose either of these two surfaces to face the circuit board.

In summary, due to a plurality of first pads and a plurality of second pads are respectively disposed on the first surface and the second surface of the substrate and connected by the first interconnecting structure, a chip package and a substrate thereof according to the present invention is capable of providing the flexibility in design and in manufacture. The various multi-package modules according to the present invention may provide more pads to meet the practical requirements, reduce the package scale, simplify the circuit layout of the package, and further release the disposition density of the pads and prevent from electrical interference caused by high density of pad disposition. Comparing with the prior art, each of the chip packages can perform a functional test before coupling with another chip package to ensure the reliability of each of the chip packages, improve the quality and the yield of the chip package, and reduce the manufacturing cost.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A chip package, comprising:
   a substrate comprising a plurality of first pads, a plurality of second pads, a plurality of third pads and at least one first interconnecting structure, wherein the first pads are located on a first surface of the substrate, and the second pads and the third pads are located on a second surface of the substrate, and projections of the second pads on the second surface and projections of the third pads on the second surface does not overlap, and the first interconnecting structure is deposited within the substrate;
   at least one first chip disposed on the first surface of the substrate, wherein projections of the first pads on the first surface and a projection of the first chip on the first surface does not overlap, the first interconnecting structure is directly coupled with the first chip, one of the first pads and one of the second pads, and one of the first pad and the second pad acts as an input/output terminal of the first chip while the other one as a test terminal of the first chip; and
   a second package coupled to the substrate through the third pads.

2. The chip package according to claim 1, wherein the first pads and the second pads are solder mask defined (SMD) type or non-solder mask defined (NSMD) type.

3. The chip package according to claim 1, wherein the first chip is a chip set, a processor, a memory, a communication chip, or a graphic chip.

4. The chip package according to claim 1, further comprising: an insulating layer filling in a space between the first chip and the first surface.

5. The chip package according to claim 1, wherein the substrate further comprising:
   at least one second interconnecting structure coupled with the first chip and one of the third pads.

6. The chip package according to claim 5, wherein the second package is coupled to the first chip through the second interconnecting structure.

7. The chip package according to claim 6, wherein the second package comprises at least one second chip and the second chip is a chip set, a processor, a memory, a communication chip, or a graphic chip.

8. The chip package according to claim 1, further comprising: a third chip located on the first surface of the substrate coupled with the first chip through at least one third interconnecting structure of the substrate.

9. The chip package according to claim 1, wherein the input/output terminal is signal terminal, ground terminal or power terminal.

10. The chip package according to claim 1, further comprising: a plurality of bumps or solder balls connected with the first pads or the second pads which act as the input/output terminal.

11. A substrate capable of coupling at least one first chip, comprising:
    a first surface which the first chip is disposed on the first surface;
    a second surface disposed opposite to the first surface;
    at least one first pad located on the first surface;
    at least one second pad located on the second surface;
    at least one third pad located on the second surface; and
    at least one first interconnecting structure directly coupled with the first chip, the first pad and the second pad,
    wherein a projection of the first pad on the first surface and a projection of the first chip on the first surface does not overlap, and a projection of the second pad on the second surface and a projection of the third pad on the second surface does not overlap, and the first interconnecting structure is deposited within the substrate, and
    wherein one of the first pad and the second pad acts as an input/output terminal of the first chip while the other one as a test terminal of the first chip.

12. The substrate according to claim 11, further comprising:
    at least one second interconnecting structure coupled with the first chip and the third pad.

13. The substrate according to claim 12, wherein the third pad is coupled to a chip package.

14. The substrate according to claim 13, wherein the chip package has at least one second chip.

15. The substrate according to claim 11, wherein at least one third chip is disposed on the first surface or the second surface, and the third chip is coupled with the first chip through at least one third interconnecting structure of the substrate.

16. The chip package according to claim 1, wherein the projections of the second pads on the substrate and the projection of the first chip on the substrate does not overlap.

17. The chip package according to claim 16, wherein the projections of the second pads on the substrate surround the projection of the first chip on the substrate.

18. The substrate according to claim 11, wherein the projections of the second pads on the substrate and the projection of the first chip on the substrate does not overlap.

19. The substrate according to claim 18, wherein the projections of the second pads on the substrate surround the projection of the first chip on the substrate.

20. The chip package according to claim 1, wherein the second package is directly coupled to the second surface of the substrate through the third pads.

* * * * *